United States Patent
Jeong et al.

(10) Patent No.: US 11,244,997 B2
(45) Date of Patent: Feb. 8, 2022

(54) DISPLAY APPARATUS

(71) Applicant: Samsung Display Co., LTD., Yongin-si (KR)

(72) Inventors: Minjae Jeong, Hwaseong-si (KR); Kyung-Hoon Kim, Uiwang-si (KR); Meehye Jung, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/924,432

(22) Filed: Jul. 9, 2020

(65) Prior Publication Data
US 2020/0343331 A1    Oct. 29, 2020

Related U.S. Application Data

(63) Continuation of application No. 16/235,415, filed on Dec. 28, 2018, now Pat. No. 10,727,293.

(30) Foreign Application Priority Data

Jan. 3, 2018    (KR) .......................... 10-2018-0000945

(51) Int. Cl.
| | | |
|---|---|---|
| *G09G 3/3225* | (2016.01) | |
| *H01L 27/32* | (2006.01) | |
| *H01L 51/52* | (2006.01) | |
| *H01L 51/50* | (2006.01) | |
| *G09G 3/3275* | (2016.01) | |

(52) U.S. Cl.
CPC ....... *H01L 27/3276* (2013.01); *G09G 3/3225* (2013.01); *G09G 3/3275* (2013.01); *H01L 27/3246* (2013.01); *H01L 27/3262* (2013.01); *H01L 51/5012* (2013.01); *H01L 51/5256* (2013.01); *G09G 2300/0426* (2013.01); *G09G 2300/0439* (2013.01)

(58) Field of Classification Search
CPC ............... G09G 3/3225; G09G 3/3275; G09G 2300/0426; G09G 2300/0439; H01L 27/3276; H01L 27/3246; H01L 27/3262
See application file for complete search history.

(56) References Cited

U.S. PATENT DOCUMENTS

| | | | |
|---|---|---|---|
| 2014/0041917 A1* | 2/2014 | Qin | .......................... H05K 1/18 174/260 |
| 2017/0293181 A1 | 10/2017 | Jung et al. | |
| 2019/0189075 A1 | 6/2019 | Kim | |

FOREIGN PATENT DOCUMENTS

KR    10-2016-0100012    8/2016

* cited by examiner

*Primary Examiner* — Robert J Michaud
(74) *Attorney, Agent, or Firm* — Kile Park Reed & Houtteman PLLC

(57) ABSTRACT

A display apparatus includes a base substrate, a plurality of data lines disposed in a display area on the base substrate, wherein at least a portion of the data lines extend to a first peripheral area adjacent to the display area, a plurality of detour lines disposed in the display area, wherein at least a portion of the detour lines extend to the first peripheral area, and a data driver electrically connected to the data lines and the detour lines, wherein at least one of the data lines electrically contacts at least one of the detour lines in the first peripheral area.

20 Claims, 17 Drawing Sheets

DISPLAY APPARATUS

CROSS-REFERENCE TO RELATED APPLICATION

This is a continuation application based on currently pending U.S. patent application Ser. No. 16/235,415, filed on Dec. 28, 2018, the disclosure of which is incorporated herein by reference in its entirety. U.S. patent application Ser. No. 16/235,415 claims priority benefit of Korean Patent Application No. 10-2018-0000945, filed on Jan. 3, 2018 in the Korean Intellectual Property Office, the disclosure of which is incorporated herein by reference in its entirety for all purposes.

BACKGROUND

1. Field

Example embodiments relate to a display apparatus.

2. Description of the Related Art

A cathode ray tube (CRT) display apparatus has been used as a display apparatus due to its performance and competitive price. However the CRT display apparatus has disadvantages of a large size and poor portability. Therefore a display apparatus such as a plasma display apparatus, a liquid crystal display apparatus and an organic light emitting display apparatus has been highly regarded due to the small size, light weight and low-power-consumption of these types of display apparatus.

SUMMARY

Embodiments are directed to a display apparatus including a display area in which an image is displayed and a peripheral area that is a non-display area, a base substrate, a plurality of data lines located on the base substrate in the display area and extending to the peripheral area, a plurality of detour data lines on the base substrate in the display area and in the peripheral area, and a pad portion in the peripheral area, the detour data lines and at least one of the data lines being directly connected to the pad portion, and at least one of the data lines being not directly connected to the pad portion, wherein at least one of the data lines not directly connected to the pad portion is electrically connected to the detour data line.

The display apparatus may further include an insulation layer between the data lines and the detour data lines, and a contact hole extending through the insulation layer in the peripheral area, wherein the at least one of the data lines not directly connected to the pad portion is electrically connected to the detour data line through the contact hole.

The detour data line may overlap the data lines in the display area.

The display apparatus may further include a plurality of pixels having a matrix form in a first direction and a second direction perpendicular to the first direction, the plurality of pixels including a thin film transistor in the display area. The data lines may extend in the second direction. The pad portion may be disposed in the peripheral area adjacent to the display area in the second direction.

A folding area may be in the peripheral area between the pad portion and the display area. The base substrate in the folding area may be bent such that the pad portion overlaps at least a portion of the display area.

At least one of the data lines may overlap one of the detour data lines in the folding area.

The display apparatus may further include a buffer layer on the base substrate, an active layer on the buffer layer, a gate insulation layer on the active layer, a data conductive pattern including the data lines on the gate insulation layer, and a data insulation layer on the data conductive pattern. The buffer layer, the gate insulating layer, and the data insulating layer may not be present in the folding area, and an insulating pattern may be on the base substrate in the folding area.

The display area may include a front portion on a plane defined by the first direction and the second direction and an edge portion adjacent to the front portion in the first direction. The data lines may be in the front portion and in the edge portion. The edge portion may be bent toward a third direction perpendicular to the first direction and the second direction.

The data lines in the edge portion may be connected to the pad portion through the detour data line. The data lines in the front portion may be connected to the pad portion without a connection passing through the detour data line.

An edge portion of the display area may include a rounded portion. The data lines may be in the rounded portion and in a middle of the display area. The data lines in the rounded portion may be connected to the pad portion through the detour data lines. The data lines in the middle of the display area are connected to the pad portion without a connection passing through a detour data line.

The display area may be circular. The data lines may be in a side of the display area in the first direction and in a middle of the display area. The data lines located at a side of the display area in the first direction may be electrically connected to the pad portion through the detour data line. The data lines in the middle of the display area may be connected to the pad portion without a connection passing through a detour data line.

Each of the pixels may include a contact pad located on the insulation layer and electrically connected to the thin film transistor, a first electrode electrically connected to the contact pad, a second electrode on the first electrode, and a light emitting structure between the first electrode and the second electrode. The detour data lines and the contact pad may be formed from a same layer.

The detour data lines may be between the data lines and the base substrate.

The data lines may include a first data line, an n-th data line, an n+1-th data line and a x-th data line, n and x being natural numbers where 1<n<n+1<x. The detour data lines may include a first detour data line and a n-th data line. The contact hole may include a first contact hole and an n-th contact hole. The first data line may be electrically connected to the first detour data line through the first contact hole. The n-th data line may be electrically connected to the n-th detour data line through the n-th contact hole. The first data line and the n-th data line may be electrically connected to the pad portion through the first detour data line and the n-th detour data line. The x-th data line may be electrically connected to the pad portion without a connection passing the detour data line.

Embodiments are also directed to a display apparatus including a display area in which an image is displayed and a peripheral area that is a non-display area, a first data line in the display area and extending to the peripheral area, a first detour data line in the display area and extending to the peripheral area, an insulation layer between the first data line and the first detour data line to insulate the first data line from the first detour data line, a pad portion in the peripheral area and connected to a driving chip configured to provide data signal to the first data line, and a first contact hole through the insulation layer in the peripheral area. The first data line may be connected to the first detour data line through the first contact hole. The first detour data line may be electrically connected to the pad portion.

The display apparatus may further include an n-th data line and x-th data line that are located in the display area and extend into the peripheral area, n and x being natural numbers where 1<n<x, an n-th detour data line that is located in the display area and extends into the peripheral area, an n-th contact hole through the insulation layer in the peripheral area. The n-th data line may be electrically connected to the n-th detour data line through the n-th contact hole. The n-th detour data line may be electrically connected to the pad portion. The x-th data line may be electrically connected to the pad portion.

The n-th detour data line, the first detour data line, and the x-th data line may be sequentially connected to the pad portion along one direction.

The display apparatus may further include a n+1-th data line and a x+1-th data line that are located in the display area and extend into the peripheral area. The n+1-th and x+1-th data lines may be electrically connected to the pad portion. The n+1-th data line, the x-th data line, the n-th detour data line, and the first detour data line may be electrically connected to the pad portion in order along one direction.

The display area may include a front portion on a plane defined by a first direction and a second direction perpendicular to the first direction, and an edge portion adjacent to the front portion in the first direction. The edge portion may be bent toward a third direction that is perpendicular to the first and second directions. The first data line may be in the edge portion of the display area, and the x-th data line may be in the front portion.

A rounded portion may be at the edge of the front portion of the display area. The display apparatus may further include an m-th data line at the edge portion of the display area and extending into the peripheral area, m being a natural number where 1<m<n, and an m-th detour data line at the edge portion of the display area and extending into the peripheral area. The n-th data line may be located to correspond to the round portion of the front portion. The m-th contact hole may pass through the insulation layer in the peripheral area. The m-th data line may be electrically connected to the m-th detour data line through the m-th contact hole. The m-th detour data line may be electrically connected to the pad portion.

The display area may be circular.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
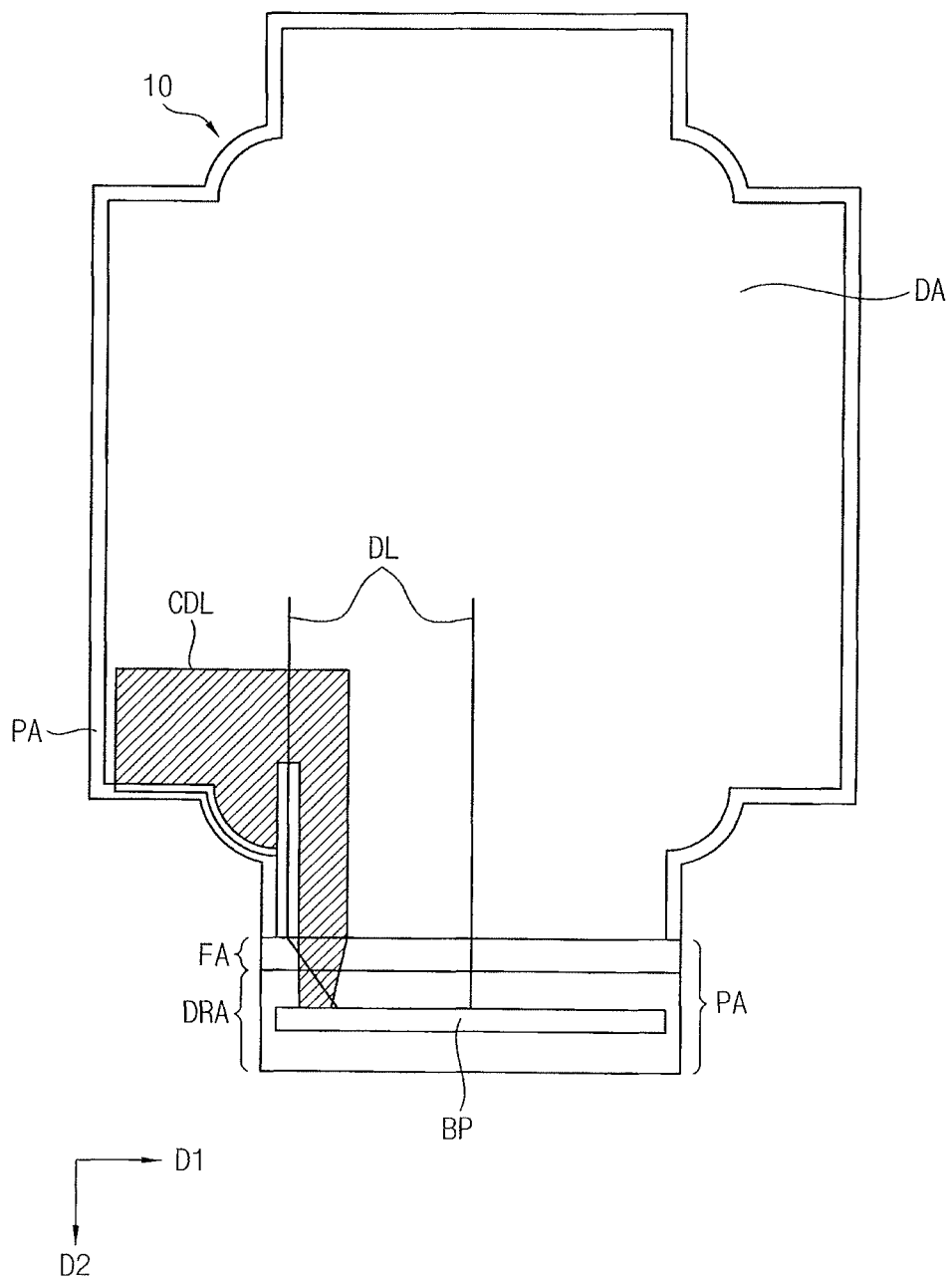
FIG. 1 illustrates a plan view of a display apparatus according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a plan view of a display apparatus according to an example embodiment.

Referring to FIG. 1, the display apparatus may include a display area DA in which an image is displayed and a peripheral area PA, which is a non-display area adjacent to and surrounding the display area DA.

The display area DA may include a front portion (refers to DAF of FIG. 5), which is disposed on a plane formed by a first direction D1 and a second direction D2\perpendicular to the first direction D1, an upper edge portion (refers to DAU of FIG. 5), which is disposed adjacent to the front portion in the second direction D2 and connected to an upper side of the front portion, a left edge portion (refers to DAL of FIG. 5), which is disposed adjacent to the front portion in the first direction D1 and connected to a left side of the front portion, a right edge portion (refers to DAR of FIG. 5), which is disposed adjacent to the front portion in the first direction D1 and connected to right side of the front portion, and a lower edge portion (refers to DAD of FIG. 5), which is disposed adjacent to the front portion in the second direction D2 and connected to a lower side of the front portion.

Four corners of the front portion, for example, points where the upper edge portion, the right edge portion, the lower edge portion, and the left edge portion meet with each other, may be rounded.

The display apparatus may include a plurality of pixels for displaying the image. The plurality of pixels may be arranged in a matrix form in the display area DA. Each pixel may include a thin film transistor. A plurality of data lines DL and a plurality of gate lines may be electrically connected to the pixels. In addition, the display apparatus may further include a plurality of detour data lines CDL disposed in the display area DA and electrically connected to the respective data lines DL.

The data lines DL may be arranged in the first direction D1. Each of the data lines DL may extend in the second direction D2. Each of the gate lines may extend in the first direction D1 and cross the data lines DL.

The peripheral area PA is a non-display area. The peripheral area PA may be disposed adjacent to the display area DA to surround edges of the display area DA. A circuit structure for driving the pixels in the display area DA may be formed in the peripheral area PA.

The peripheral area PA may include a first portion, which is adjacent to the upper edge portion, the right edge portion and the left edge portion, and a second portion, which is adjacent to the lower edge portion. The second portion of the peripheral area PA may include a driver area DRA in which a pad portion BP is disposed and a folding area, which is folded such that the driver area DRA is located at a back surface of the display apparatus. The first portion, which is adjacent to the upper edge portion, the right edge portion, and the left edge portion, may have a narrower width than the second portion.

The data lines DL connected to the pixels in the left edge portion may be electrically connected to the detour data lines CDL through contact holes (see CNT 1 and the like in FIG. 2) formed in the peripheral area PA. Thus, an end of a data line DL that is connected to the pixel in the left edge portion and an end of the detour data line CDL may extend through the display area DA to the peripheral area PA. The end of the data line DL and the end of the detour data line CDL may be connected to each other through the contact hole formed in the peripheral area PA. Each detour data line CDL may extend from the respective contact hole through the display area DA to overlap the respective data line DL. The detour data lines may be connected to the pad portion BP in the driver area DRA of the peripheral area PA. The data lines DL that are electrically connected to the pixels in the upper edge portion and the front portion may extend in the second direction D2 and may be electrically connected to the pad portion BP in the driver area DRA of the peripheral area PA.

A driving circuit chip may be mounted on the pad portion BP. The pad portion BP may include a plurality of terminals electrically connected to the respective data lines.

The right edge portion may have a structure in which data lines and detours data lines are connected to each other, similar to the structure of the left edge portion.

According to example embodiments, the data lines DL disposed in the left edge portion, the right edge portion, and the rounded portion of the corners of the front portion in the display area DA of the display apparatus may be electrically connected to the pad portion BP through the detour data lines CDL. The pad portion BP may be disposed in the driver area DRA of the peripheral area PA which is adjacent to the lower edge portion of the display area DA of the display apparatus. Accordingly, a spider line connected to the data line in the left edge portion, the right edge portion, and the peripheral area PA adjacent to the rounded portion may be omitted such that a width of the peripheral area PA can be narrowed.

In addition, the folding area FA may be folded (see FIG. 5), and the driver area DRA may be disposed on the back surface of the display area DA to overlap with the display area DA. Thus, a display apparatus in which the non-display area is minimized can be provided.

Figure 2:
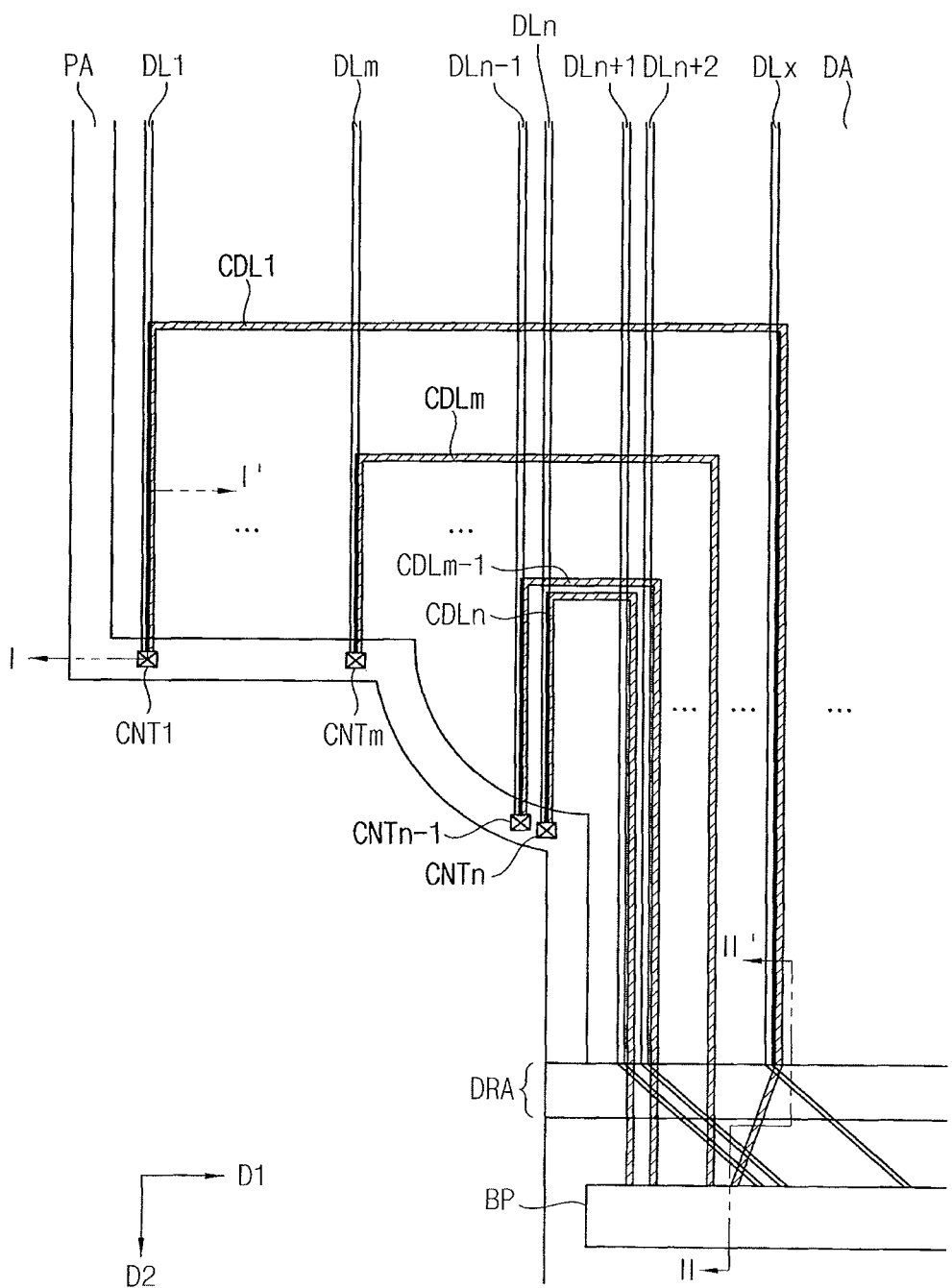
FIG. 2 illustrates an enlarged view of a lower left portion of the display apparatus of FIG. 1.

FIG. 2 illustrates an enlarged view of a lower left portion of the display apparatus of FIG. 1.

Referring to FIGS. 1 and 2, the data lines DL may include a first data line DL1, a m-th data line DLm, a n−1-th data line DLn−1, a n-th data line DLn, a n+1-th data line DLn+1, a n+2-th data line DLn+2, and a x-th data line DLx.

The detour data line CDL may include a first detour data line CDL1, a m-th detour data line CDLm, a n−1-th detour data line CDLn−1, and a n-th detour data line CDLn.

Each of the first data line DL1, the m-th data line DLm, the n−1-th data line DLn−1, the n-th data line DLn, the n+1-th data line DLn+1, the n+2-th data line DLn+2 and the x-th data line, and the x-th data line DLx may extend in the second direction D2. A portion of the data lines DL may extend to the peripheral area PA passing through the display area DA.

The first data line DL1 and the m-th data line DLm may be disposed in the left edge portion of the display area DA, and may extend in the second direction D2. The n−1-th data line DLn−1 and the n-th data line DLn may be disposed at the rounded portion of the front portion of the display area DA, and may extend in the second direction D2.

The n+1-th data line DLn+1, the n+2-th data line DLn+2 and the x-th data line DLx may be disposed in the front portion of the display area DA, and extend to the pad portion BP through the folding area FA in the second direction.

In the peripheral area PA, the first data line DL1, the m-th data line DLm, the n−1-th data line DLn−1 and the n-th data line DLn may be electrically connected to the first detour data line CDL1, the m-th detour data line CDLm, the n−1-th detour data line CDLn−1 and the n-th detour data line CDLn through a first contact hole CNT1, a m-th contact hole CNTm, a n−1-th contact hole CNTn−1, and a n-th contact hole CNTn, respectively.

The first detour data line CDL1 may extend from the first contact hole CNT1 of the peripheral area PA adjacent to the left edge portion of the display area DA through the display area DA and the folding area FA to the pad portion BP. For example, the first detour data line CDL1 may extend from the first contact hole CNT1 along a direction opposite to the second direction D2, along the first direction D1 and along the second direction D2 to the pad portion BP with forming a C-shape.

The m-th detour data line CDLm may extend from the m-th contact hole CNTm in the peripheral area PA adjacent to the left edge portion of the display area DA through the display area DA and the folding area FA to the pad portion BP. For example, the m-th detour data line CDLm may extend from the m-th contact hole CNTm along the direction opposite to the second direction D2, along the first direction D1 and along the second direction D2 to the pad portion BP with forming a C-shape.

The n−1-th detour data line CDLn−1 may extend from the n−1-th contact hole CNTn−1 in the peripheral area PA adjacent to the rounded portion of the front portion of the display area DA through the display area DA and the folding area FA to the pad portion BP. For example, the n−1-th detour data line CDLn−1 may extend from the n−1-th contact hole CNTn−1 along the direction opposite to the second direction D2, along the first direction D1 and along the second direction D2 to the pad portion BP with forming a C-shape.

The n-th detour data line CDLn may be extend from the n-th contact hole CNTn in the peripheral area PA adjacent to the rounded portion of the front portion of the display area DA through the display area DA and the folding area FA to the pad portion BP. For example, the n-th detour data line CDLn may extend from the n-th contact hole CNTn along the direction opposite to the second direction D2, along the first direction D1 and along the second direction D2 to the pad portion BP with forming a C-shape.

The data lines and the detour data lines may be formed in a similar arrangement in the right edge portion of the display area DA of the display apparatus.

The data lines DL that are disposed in the left edge portion, the rounded portion of the front portion and the right edge portion may be connected to the pad portion BP by the detour data line CDL in the display area DA. The data lines DL and the detour data lines CDL in the folding area FA and the driver area DRA may be a fan-in in the second direction D2.

Figure 3A:
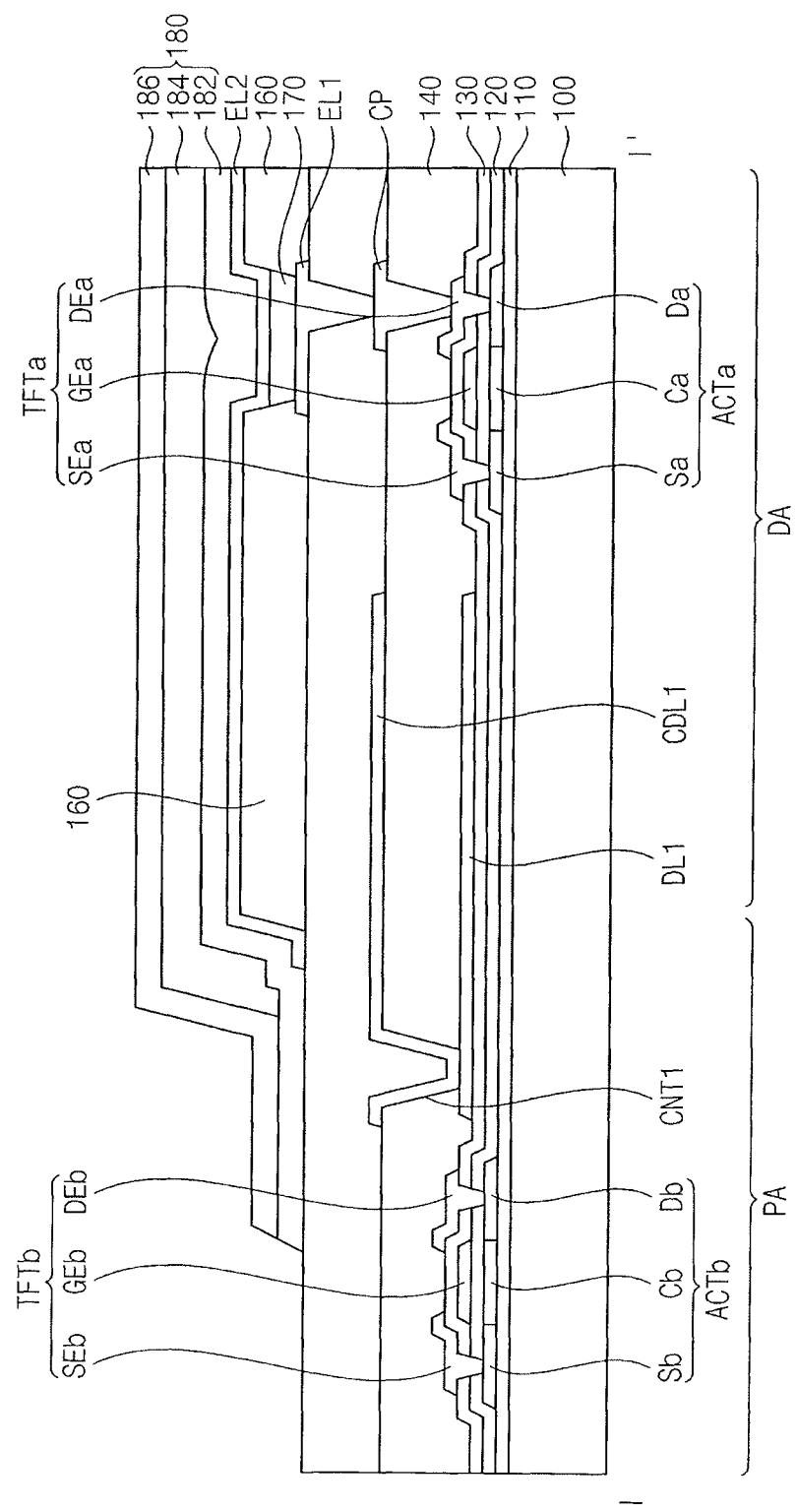
FIG. 3A illustrates a cross-sectional view taken along a line I-I' of FIG. 2.
Figure 3B:
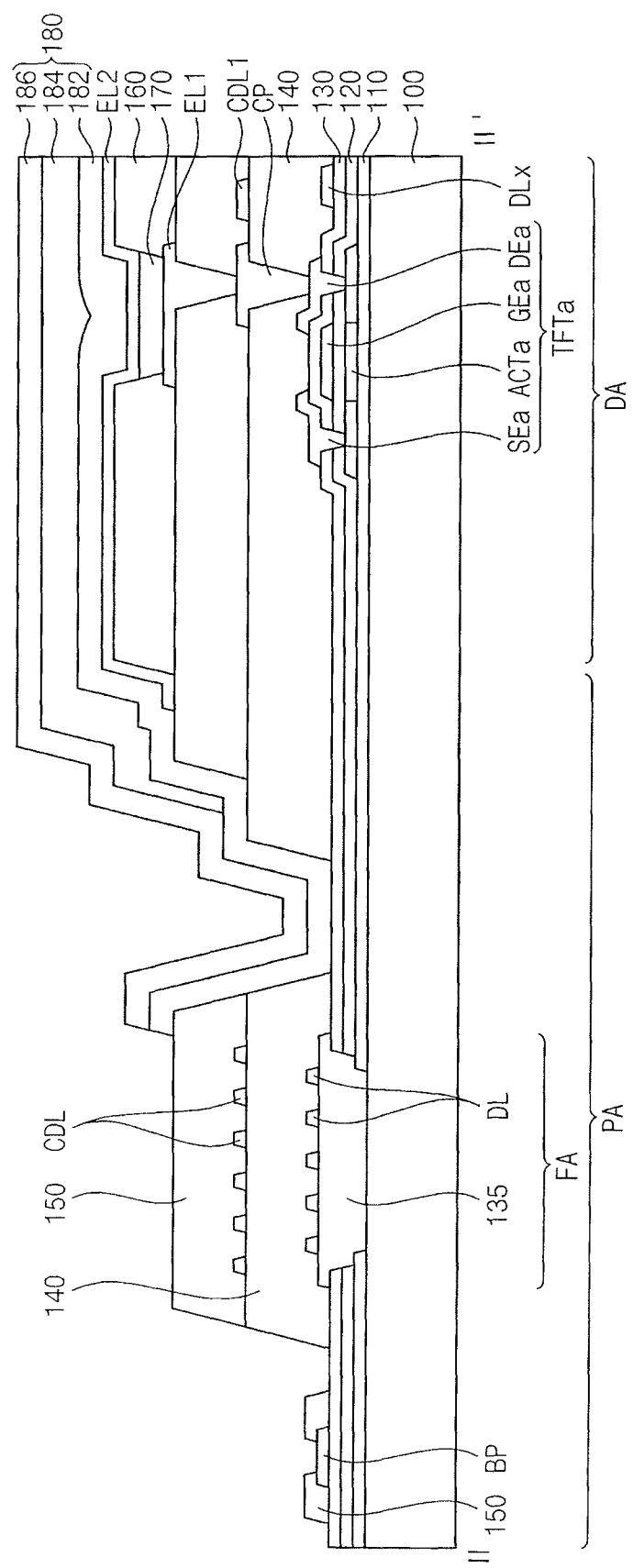
FIG. 3B illustrates a cross-sectional view taken along a line II-II' of FIG. 2.

FIG. 3A illustrates a cross-sectional view taken along a line I-I' of FIG. 2. FIG. 3B illustrates a cross-sectional view taken along a line II-II' of FIG. 2.

Referring to FIGS. 1, 2, 3A and 3B, the display apparatus may include a base substrate 100, a buffer layer 110, a gate insulation layer 120, a gate conductive pattern, a data insulation layer 130, an insulation pattern 135, a data conductive pattern, a first thin film transistor TFTa, a second first thin film transistor TFTb, a first insulation layer 140, detour data conductive pattern, a second insulation layer 150, a first electrode EL1, a pixel defining layer 160, a light emitting structure 170, a second electrode EL2 and a thin film encapsulation (TFE) layer 180.

The base substrate 100 may include a transparent insulation substrate. For example, the base substrate 100 may include a flexible transparent resin substrate. Examples of the transparent resin substrate for the base substrate 100 may include a polyimide-based resin, an acryl-based resin, a polyacrylate-based resin, a polycarbonate-based resin, a polyether-based resin, a sulfonic acid containing resin, aa polyethyleneterephthalate-based resin, etc. For example, the base substrate 100 may be a polyimide resin film.

The buffer layer 110 may prevent diffusion of metal atoms and/or impurities from the base substrate 100. Additionally, the buffer layer 110 may adjust a heat transfer rate of a successive crystallization process for an active pattern, thereby obtaining a substantially uniform active pattern. If the base substrate 100 has a relatively irregular surface, the buffer layer 110 may improve flatness of the surface of the base substrate 100. The buffer layer 110 may be formed using a silicon compound. For example, the buffer layer 110 may include silicon oxide (SiOx), silicon nitride (SiNx), silicon oxynitride (SiOxNy), silicon oxycarbide (SiOxCy), silicon carbon nitride (SiCxNy), etc.

The buffer layer 110 may be omitted from the folding area FA of the peripheral area PA. For example, the buffer layer 110 may not be formed or may be removed in the folding area FA. If the buffer layer 110, which is an inorganic film, were to be formed in the folding area FA, damage to the buffer layer 110, such as cracks, could occur when the display apparatus is folded in the folding portion FA.

The active pattern may be disposed on the buffer layer 110. The active pattern may include a first active pattern ACTa of the first thin film transistor TFTa, which is disposed in the display area DA and forms a pixel structure, and a second active pattern ACTb, which is disposed in the peripheral area PA and forms a driving circuit. The driving circuit may be an amorphous silicon gate (ASG) circuit.

The first active pattern ACTa may include a first drain region Da and a first source region Sa doped by an impurity and a first channel region Ca between the first drain region Da and the first source region Sa. The second active pattern ACTb may include a second drain region Db and a second source region Sb doped by an impurity and a second channel region Cb between the second drain region Db and the second source region Sb.

The gate insulation layer 120 may be disposed on the active pattern. The gate insulation layer 120 may be formed using silicon compound such as silicon oxide (SiOx), silicon nitride (SiNx), silicon oxynitride (SiOxNy), silicon oxycarbide (SiOxCy), silicon carbon nitride (SiCxNy), etc.

The gate insulation layer 120, like the buffer layer 110, may be omitted from the folding area FA of the peripheral area PA. For example, the gate insulation layer 120 may not be formed or may be removed in the folding area FA.

The gate conductive pattern may be disposed on the gate insulation layer 120. The gate conductive pattern may include a first gate electrode GEa of the first thin film transistor TFTa, a second gate electrode GEb of the second thin film transistor TFTb, and a signal line such as a gate line for transmitting a signal to drive the pixel. The gate conductive pattern may include a metal, an alloy, a metal nitride, a conductive metal oxide and/or a transparent conductive material. For example, the gate conductive pattern may be formed by metal such as copper, aluminum, etc.

The data insulation layer 130 may be disposed on the gate insulation layer 120 on which the gate conductive pattern is disposed. The data insulating layer 130 may be formed using a silicon compound such as silicon oxide (SiOx), silicon nitride (SiNx), silicon oxynitride (SiOxNy), silicon oxycarbide (SiOxCy), silicon carbonitride (SiCxNy), etc.

Like the buffer layer 110 and the gate insulation layer 120, the data insulation layer 130 may not be formed in the folded area FA of the peripheral area PA. For example, the data insulating layer 130 may not be formed or may be removed in the folding area FA.

The insulation pattern 135 may be disposed on the base substrate 100 in the folding area FA where the buffer layer 110, the gate insulation layer 120, and the data insulation layer 130 are not formed or removed. The insulation pattern 135 may eliminate or minimize a step difference from the data insulation layer 130 in the folding area FA. The insulation pattern 135 may include an organic insulating material that is not easily damaged when the folding area FA is folded.

The data conductive pattern may be disposed on the data insulation layer 130 and the insulation pattern 135. The data conductive pattern may include a first source electrode SEa and a first drain electrode DEa of the first thin film transistor TFTa, a second source electrode SEb and a second drain electrode DEb of the second thin film transistor TFTb, and a signal line such as a data line DL for transmitting a signal to drive the pixel. The data conductive pattern may include a metal, an alloy, a metal nitride, a conductive metal oxide and/or a transparent conductive material. For example, the data conductive pattern may be formed using a metal having high conductivity, such as copper, aluminum, or the like. The data conductive pattern may include a plurality of layers. For example, the data conductive pattern may include a titanium layer, an aluminum layer on the titanium layer, and a titanium layer on the aluminum layer. The data conductive pattern may further include terminals constituting the pad portion BP.

The data line DL may include the first data line DL1. The first data line DL1 may be electrically connected to the first source electrode SEa and may extend from the display area DA to the peripheral area PA.

The first active pattern ACTa, the first gate electrode GEa, the first source electrode SEa and the first drain electrode DEa may constitute the first thin film transistor TFTa.

The second active pattern ACTb, the second gate electrode GEb, the second source electrode SEb and the second drain electrode DEb may constitute the second thin film transistor TFTb.

The first insulation layer 140 may be disposed on the data insulation layer 130 and the insulation pattern 135 on which the data conductive pattern is disposed. The first insulating layer 140 may include an organic insulating material, and may have a substantially flat upper surface while sufficiently covering the data conductive pattern.

The detour data conductive pattern may be formed on the first insulation layer 140. The detour data conductive pattern may include a detour data line CDL and a contact pad CP. The detour data conductive pattern may include a metal, an alloy, a metal nitride, a conductive metal oxide and/or a transparent conductive material. For example, the detour data conductive pattern may be formed using a metal having high conductivity, such as copper, aluminum, or the like. The detour data conductive pattern may include a plurality of layers. For example, the detour data conductive pattern may include a titanium layer, an aluminum layer on the titanium layer, and a titanium layer on the aluminum layer.

The detour data line CDL may extend from the peripheral area PA through the display area DA and the peripheral area PA with the folding area FA to be connected to the pad portion BP. The detour data line CDL may include a first detour data line CDL1. The detour data conductive pattern may further include terminals constituting the pad portion BP. For example, a portion of the terminals of the pad portion BP may be formed in the data conductive pattern, and another portion of the terminals may be formed in the detour data conductive pattern. In addition, in some example embodiments, the pad portion BP may have a structure directly connected to the detour data line CDL and the data line DL or a structure connected through a contact hole.

The first detour data line CDL1 may be electrically connected to the first data line DL1 through a first contact hole CNT1 formed through the first insulation layer 140 in the peripheral area PA. Accordingly, the first thin film transistor TFTa in the display area DA may be connected to the pad portion BP through the first data line DL1 and the first detour data line CDL1.

The contact pad CP may have a structure that connects the drain electrode and the first electrode in each pixel structure. The contact pad CP may be connected to the first drain electrode DEa through a contact hole formed through the first insulation layer 140.

The pad portion BP may be formed on the data insulation layer 130 in the peripheral area PA. The pad portion BP may be electrically connected to the detour data line CDL and the data line DL. A driving circuit chip may be mounted on the pad portion BP.

The second insulation layer 150 may be disposed on the first insulation layer 140 where the detour data conductive pattern is disposed. The second insulation layer 150 may include an organic insulating material and may have a substantially planar top surface while sufficiently covering the detour data conductive pattern.

The first electrode EL1 may be disposed on the second insulation layer 150. The first electrode EL1 may be electrically connected to the contact pad CP through a contact hole formed through the second insulating layer 150. Accordingly, the first electrode EL1 may be electrically connected to the first thin film transistor TFTa.

The pixel defining layer 160 may be disposed on the second insulation layer 150 on which the first electrode EL1 is disposed. The pixel defining layer 160 may include an organic material or an inorganic material. For example, the pixel defining layer 160 may be formed using photoresist, acryl-based resin, polyacryl-based resin, polyimide-based resin, a silicon compound, etc. The pixel defining layer 160 may define an opening that exposes the first electrode EL1.

The light emitting structure 170 may be positioned on the first electrode EL1 exposed by the opening of the pixel defining layer 160. The light emitting structure 170 may extend on a sidewall of the opening of the pixel defining layer 160. The light emitting structure 170 may include an organic emission layer (EL), a hole injection layer (HIL), a hole transport layer (HTL), an electron transport layer (ETL), an electron injection layer (EIL), etc. In some example embodiments, the hole injection layer, the hole transport layer, the electron transport layer, and the electron injection layer may be formed in common to correspond to a plurality of pixels. In some example embodiments, a plurality of organic light emitting layers may be formed using light emitting materials for generating different colors of light such as a red color, a green color, or a blue color in accordance with color pixels of the display device. In some example embodiments, the organic light emitting layer of the of the light emitting structure 170 may include a plurality of stacked light emitting materials for generating a red light, a green light or a blue light to thereby emitting a white light. Elements of the light emitting structure 170 may be commonly formed so as to correspond to a plurality of pixels, and each pixel can be divided by a color filter layer.

The second electrode EL 2 may be disposed on the pixel defining layer 160 and the light emitting structures 170.

The thin film encapsulation (TFE) layer 180 may be formed on the second insulating layer 150, the pixel defining layer 160, and the second electrode EL2. The TFE layer 180 may have a structure in which at least one organic layer made of organic material and at least one inorganic layer made of inorganic materials are alternately stacked as a thin film encapsulation layer. For example, the TFE layer 180 may include a first inorganic layer 182, an organic layer 184 disposed on the first inorganic layer 182, and a second inorganic layer 184 disposed on the organic layer 184.

Figure 4:
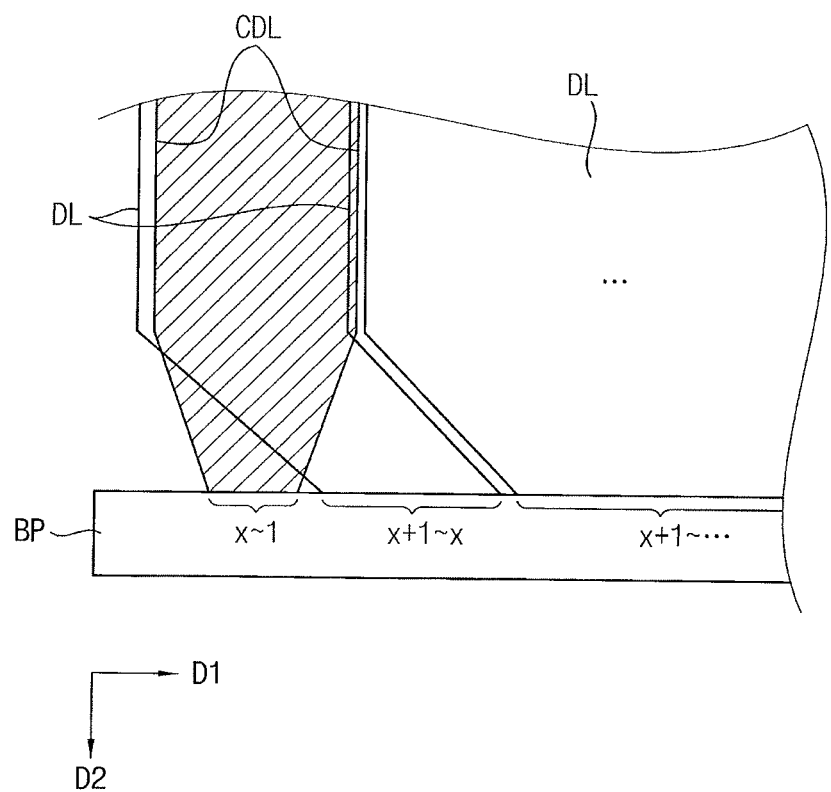
FIG. 4 illustrates an enlarged view to explain a connection of a data line DL, a detour data line CDP and a pad portion BP of the display apparatus of FIG. 1.

FIG. 4 illustrates an enlarged view to explain connection of a data line DL, a detour data line CDP and a pad portion BP of the display apparatus of FIG. 1.

Referring to FIGS. 1, 2 and 4, first to n-th data lines may correspond to the left edge portion and the rounded portion of the front portion of the display area DA. The first to n-th data lines may be connected to first to n-th detour data lines. The n+1-th to x-th data lines may correspond to the left portion of the front portion of the display area, and the n+1-th to x+1-th data lines may overlap with at least one of the detour data lines in the display area DA. A x+1-th data line and the plurality of data lines after the x+1-th data line may correspond to the middle of the front portion of the display area DA. The x+1-th data line and the like may be directly connected to the pad portion BP without overlapping the detour data line. (Here, x>n+1).

Thus, in the pad portion BP, a plurality of terminals are electrically connected to the n-th data line to the first data line, the n+1-th data line to the x-th data line, and the x+1-th data line to the plurality of data lines after the x+1-th data line in order along the first direction, respectively. Thus, the data signals provided to the data lines may be reversed partly in reverse order by the detour data lines.

In addition, when a size of the pad portion BP is narrower than a width of the data lines DL and the entire detour data lines CDL, the data lines DL and the detour data lines CDL may be a fan-in extending from the folding area FA and the peripheral area PA along the second direction D2.

Figure 5:
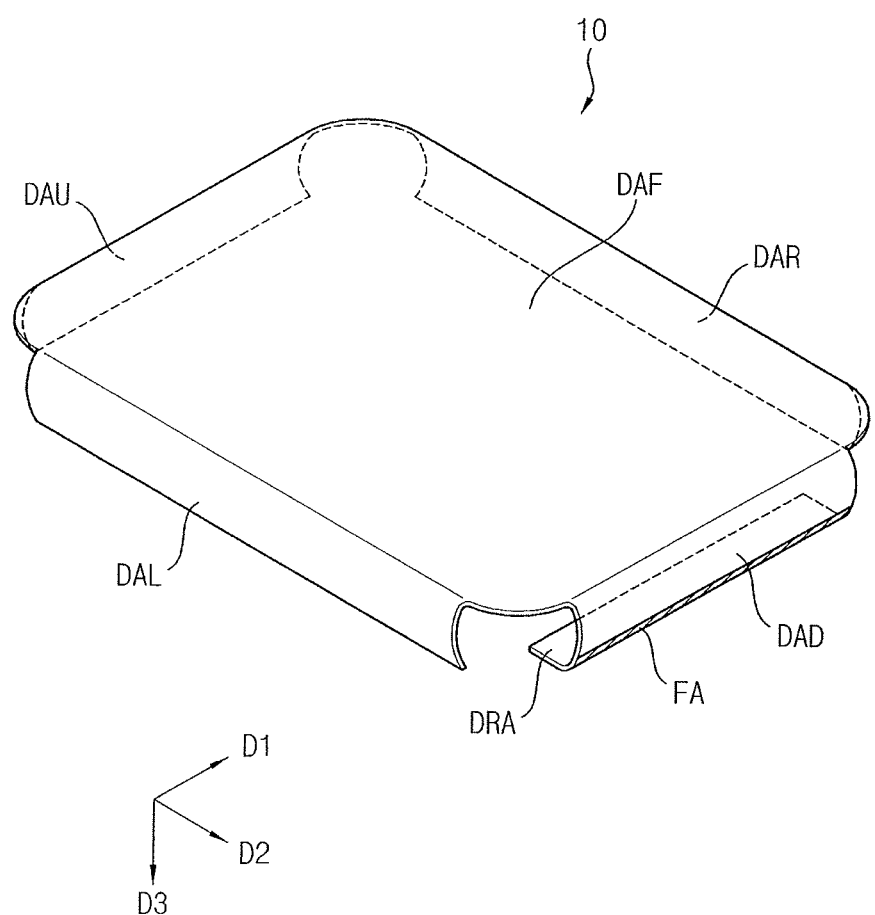
FIG. 5 illustrates a perspective view of an example in which the display apparatus of FIG. 1 is used in an electronic device.

FIG. 5 illustrates a perspective view of an example in which the display apparatus of FIG. 1 is used in an electronic device.

Referring to FIGS. 1 and 5, the display apparatus may include a display area DA including a front portion DAF, an upper edge portion DAU, a right edge portion DAR, a lower edge portion DAD, and a left edge portion DAL. the upper edge portion DAU, the right edge portion DAR, the lower edge portion DAD and the left edge portion DAL may bend gently in a third direction D3 perpendicular to the first direction D1 and the second direction D2. The folding area FA connected to the lower edge DAD may be bent such that the driver area DRA is disposed on the back surface of the display apparatus. Accordingly, a four-sided edge display may be implemented, and the driver area DRA on which the driving circuit chip is mounted may be positioned at the back surface of the display apparatus such that the non-display area recognized by the user can be minimized. The display apparatus may be used to manufacture a smart phone having a four-sided edge display.

The front portion DAF may include the rounded portion at the edge. A spider line connected to a plurality of data lines is not formed in the peripheral area PA which is the non-display area adjacent to the rounded portion. Instead, the detour data line CDL is formed to pass through the display area DA, such that a width of the non-display region adjacent to the edge of the rounded portion may be minimized.

According to the present example embodiments, the data lines disposed in the left edge portion LDA, the right edge portion RDA and the rounded portion of the edges of the front portion FDA may be connected to the pad portion BP, which is disposed in the driver area DRA of the peripheral area PA adjacent to the lower edge portion of the display area DA through the detour data line CDL. Accordingly, there is no spider line connected to the data line in the peripheral area PA adjacent to the left edge portion, the right edge portion, and the rounded portion. As a result, a width of the peripheral area PA may be reduced.

In addition, the folding area FA may be folded, and the driver area DRA may be disposed on the back surface of the display area DA to overlap with the display area DA. Thus, a display apparatus in which the non-display area is minimized may be provided.

In the present embodiment, the display apparatus has been described as being a flexible display in which a portion of the display apparatus that includes a flexible base substrate is capable of bending. In some implementations, a connection structure of the data line, the detour data line, and the contact hole for reducing the width of the peripheral area as disclosed herein may be applied to a general rigid organic light emitting display, a liquid crystal display, or the like.

Figure 6:
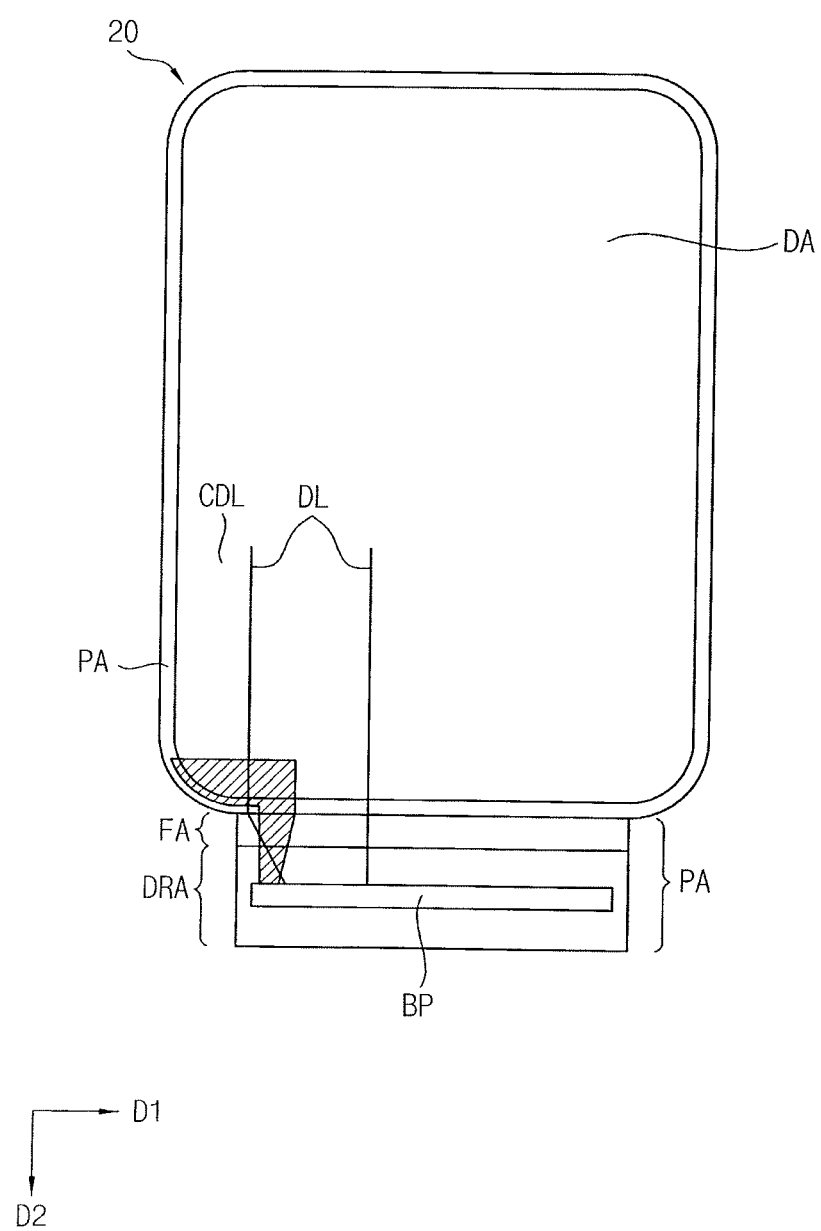
FIG. 6 illustrates a plan view of a display apparatus according to an example embodiment.

FIG. 6 illustrates a plan view of a display apparatus according to an example embodiment.

Figure 7:
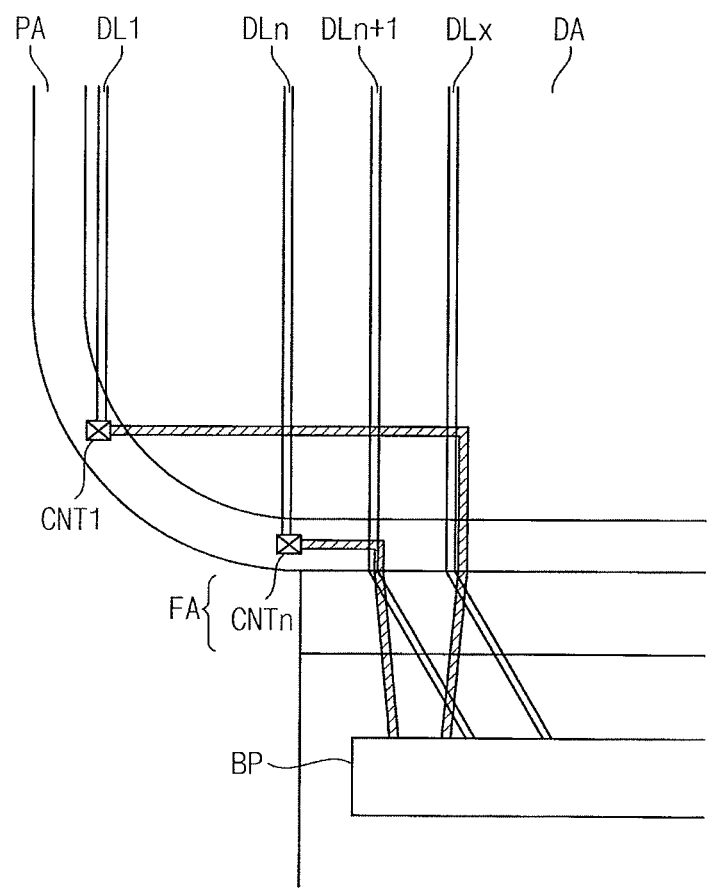
FIG. 7 illustrates an enlarged view of a lower left portion of the display apparatus of FIG. 6.

Referring to FIGS. 6 and 7, the display apparatus may be substantially same as the display apparatus of FIGS. 1 and 2, except that four corner portions of the display area DA form rounded portions instead of edge portions of a display area. Therefore, the repetitive description is simplified.

The display apparatus may include a display area DA in which an image is displayed and a peripheral area PA which is a non-display area adjacent to and surrounding the display area DA.

The display area DA may be formed on a plane formed by a first direction D1 and a second direction D2 that is perpendicular to the first direction D1.

The peripheral area PA may be disposed adjacent to the display area DA, and may surround edges of the display area DA. A circuit structure for driving the pixels in the display area DA may be formed in the peripheral area PA.

The peripheral area PA adjacent to the display area in the second direction D2 may include a driver area DRA for accommodating the pad part BP and a folding area FA that is foldable to locate the driver area DRA on a back surface of the display apparatus.

The display apparatus may include a plurality of pixels for displaying an image. The plurality of pixels may be arranged in a matrix form, in the display area DA. The pixels may each include a thin film transistor and The display apparatus may include a plurality of data lines and a plurality of gate lines that are electrically connected to the pixels. The display apparatus may further include a plurality of detour data lines CDL disposed in the display area DA and electrically connected to the respective data lines DL.

The data lines DL may include a first data line DL1, a n-th data line DLn, a n+1-th data line DLn+1, and a x-th data line DLx.

The detour data line CDL may include a first detour data line CDL1 and a n-th detour data line CDLn.

Each of the first data line DL1, the n-th data line DLn, the n+1-th data line DLn+1, and the x-th data line DLx may extend in the second direction D2A portion of the data lines may extend through the display area DA to the peripheral area PA.

The first data line DL1 and the n-th data line DLn may be disposed to correspond to the rounded portion of the display area DA, and may extend in the second direction D2. The n+1-th data line DLn+1 and the x-th data line DLx may be disposed in a middle of the display area DA, and may extend in the second direction.

The first data line DL1, and the n-th data line DLn may be electrically connected to the first detour data line CDL1, and the n-th detour data line CDLn, respectively through a respective first contact hole CNT1 and a n-th contact hole CNTn in the peripheral area PA.

The first detour data line CDL1 may extend from the first contact hole CNT1 of the peripheral area PA through the display area DA and the folding area FA to the pad portion BP. For example, the first detour data line CDL1 may extend from the first contact hole CNT1 along the first direction D1 and along the second direction D2 to the pad portion BP with forming a L-shape.

The n-th detour data line CDLn may extend from the n-th contact hole CNTn of the display area DA through the display area DA and the folding area FA to the pad portion BP. For example, the n-th detour data line CDLn may extend from the n-th contact hole CNTn along the first direction D1 and along the second direction D2 to the pad portion BP with forming a L-shape.

The data lines and the detour data lines may be formed in a similar arrangement in a right edge portion of the display area DA of the display apparatus.

According to the example embodiments, the data lines DL disposed in the rounded portion of the corners of the display area DA of the display apparatus may be electrically connected to the pad portion BP through the detour data lines CDL. The pad portion BP may be disposed in the driver area DRA of the peripheral area PA. Accordingly, there is no spider line connected to the data line in the peripheral area PA adjacent to the rounded portion, and a width of the peripheral area PA can be narrowed.

In addition, the folding area FA may be folded, and the driver area DRA may be disposed on the back surface of the display area DA to overlap with the display area DA. Thus, a display apparatus in which the non-display area is minimized can be provided.

Figure 8:
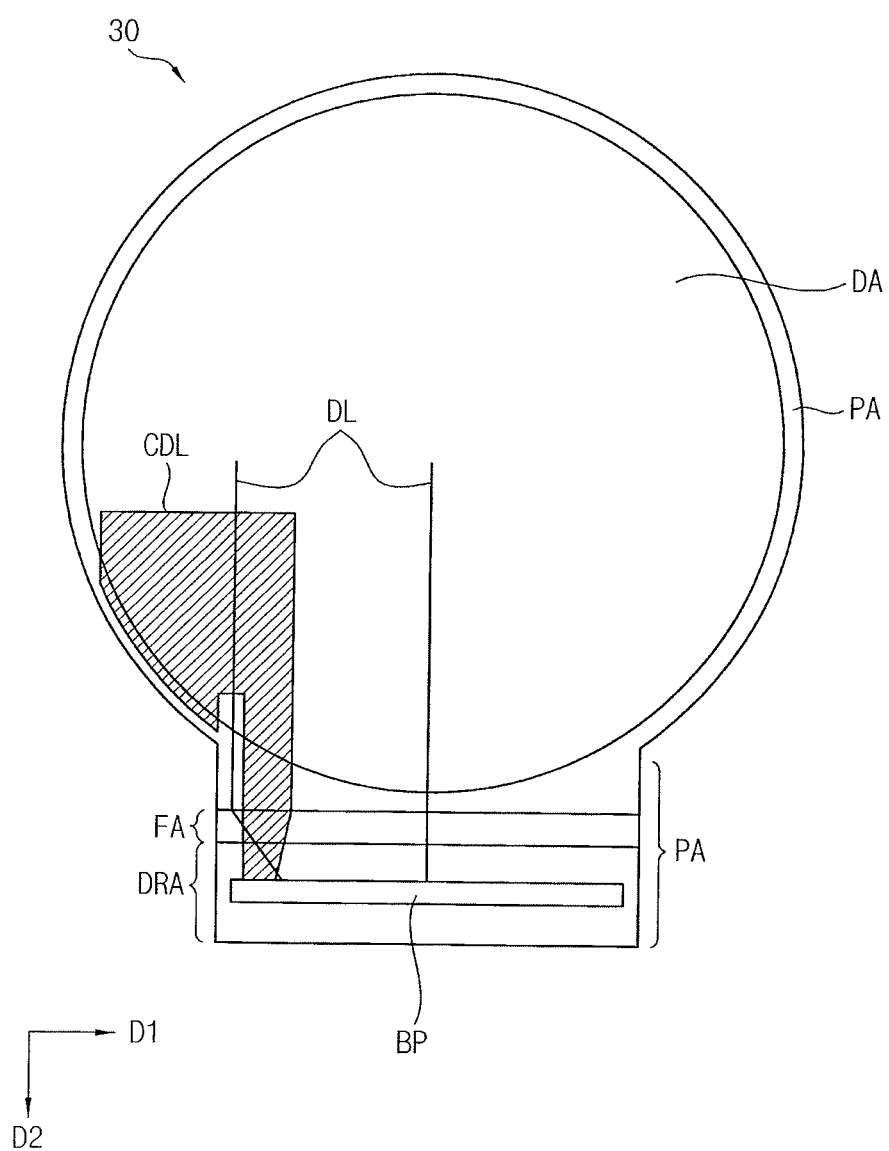
FIG. 8 illustrates a plan view of a display apparatus according to an example embodiment.
Figure 9:
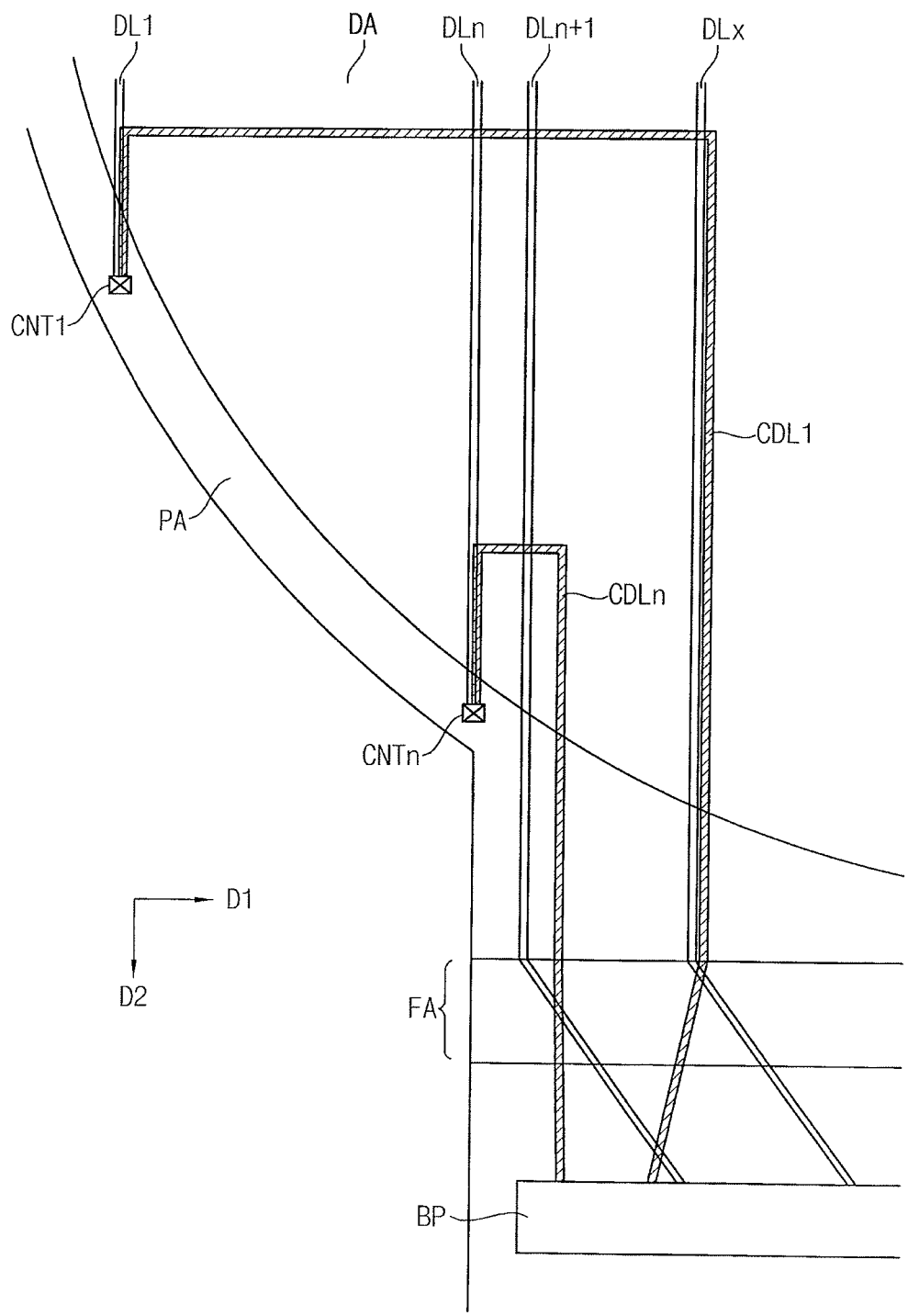
FIG. 9 illustrates an enlarged view illustrating a lower left portion of the display apparatus of FIG. 8.

FIG. 8 illustrates a plan view of a display apparatus according to an example embodiment. FIG. 9 illustrates an enlarged view of a lower left portion of the display apparatus of FIG. 8.

Referring to FIGS. 8 and 9, the display apparatus may be substantially the same as the display apparatus of FIGS. 1 and 2 or FIGS. 7 and 8, except that the display area DA is circular. Therefore, the repetitive description will be simplified.

The display apparatus may include a display area DA in which an image is displayed and a peripheral area PA, which is a non-display area adjacent to and surrounding the display area DA.

The display area DA may have a circular shape formed on a plane formed by a first direction D1 and a second direction D2 that is perpendicular to the first direction D1.

The peripheral area PA may be disposed adjacent to the display area DA and may surround the display area DA. A circuit structure for driving the pixels in the display area DA may be formed in the peripheral area PA.

The peripheral area PA adjacent to the display area in the second direction D2 may include a driver area DRA that accommodates the pad part BP and a folding area FA, which is foldable to locate the driver area DRA on a back surface of the display apparatus.

The display apparatus may include a plurality of pixels to display the image. The plurality of pixels may be arranged in a matrix form in the display area DA. The pixels may includes a thin film transistor. A plurality of data lines and a plurality of gate lines may be electrically connected to the pixels. In addition, the display apparatus may further include a plurality of detour data lines CDL disposed in the display area DA and electrically connected to the respective data lines DL.

The data lines DL may include a first data line DL1, a n-th data line DLn, a n+1-th data line DLn+1, and a x-th data line DLx.

The detour data line CDL may include a first detour data line CDL1 and a n-th detour data line CDLn.

Each of the first data line DL1, the n-th data line DLn, the n+1-th data line DLn+1, and the x-th data line DLx may extend in the second direction D2A portion of the data lines may extend through the display area DA to the peripheral area PA.

The first data line DL1 and the n-th data line DLn may extend in the second direction D2 and may be arranged to correspond to one side of the display area DA which has the circular shape in the first direction D1. The n+1-th data line DLn+1 and the x-th data line DLx may extend in the second direction D2 and may be disposed in a middle of the display area DA.

The first data line DL1 and the n-th data line DLn may be electrically connected to the first detour data lines CDL1 and the n-th detour data line CDLn through a first contact hole CNT1 and a n-th contact hole CNTn in the peripheral area PA, The first detour data line CDL1 may extend from the first contact hole CNT1 in the peripheral area PA through the display area DA and the folding area FA to the pad portion BP. For example, the first detour data line CDL1 may extend from the first contact hole CNT1 along a direction opposite to the second direction D2, along the first direction D1 and along the second direction D2 to the pad portion BP with forming a C-shape.

The n-th detour data line CDLn may be extend from the n-th contact hole CNTn in the peripheral area PA in the display area DA through the display area DA and the folding area FA to the pad portion BP. For example, the n-th detour data line CDLn may extend from the n-th contact hole CNTn along the direction opposite to the second direction D2, along the first direction D1 and along the second direction D2 to the pad portion BP with forming a C-shape.

The data lines and the detour data lines may be formed in a similar arrangement in a right portion of the display area DA of the display apparatus.

According to the example embodiments, the data lines DL disposed at both sides of the display area DA in the first direction D1 may be electrically connected to the pad portion BP through the detour data lines CDL. The pad portion BP may be disposed in the driver area DRA of the peripheral area PA, which is disposed at a lower portion of the display apparatus. Accordingly, there is no spider line connected to the data line in left and right sides of the peripheral area PA, and a width of the peripheral area PA can be narrowed.

In addition, the folding area FA may be folded, and the driver area DRA may be disposed on the back surface of the display area DA to overlap with the display area DA. Thus, a display apparatus in which the non-display area is minimized can be provided.

Figure 10:
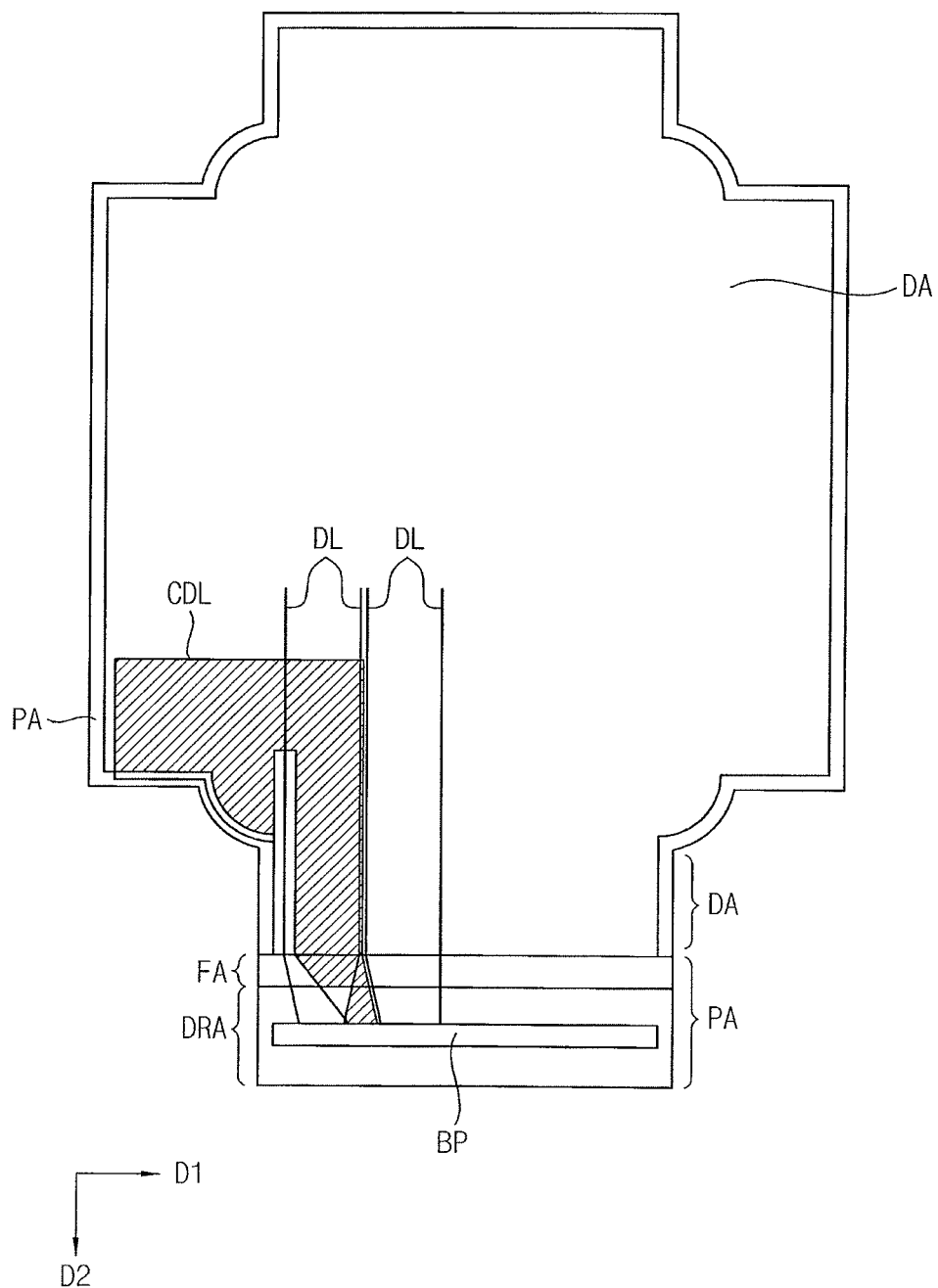
FIG. 10 illustrates a plan view of a display apparatus according to an example embodiment.
Figure 11:
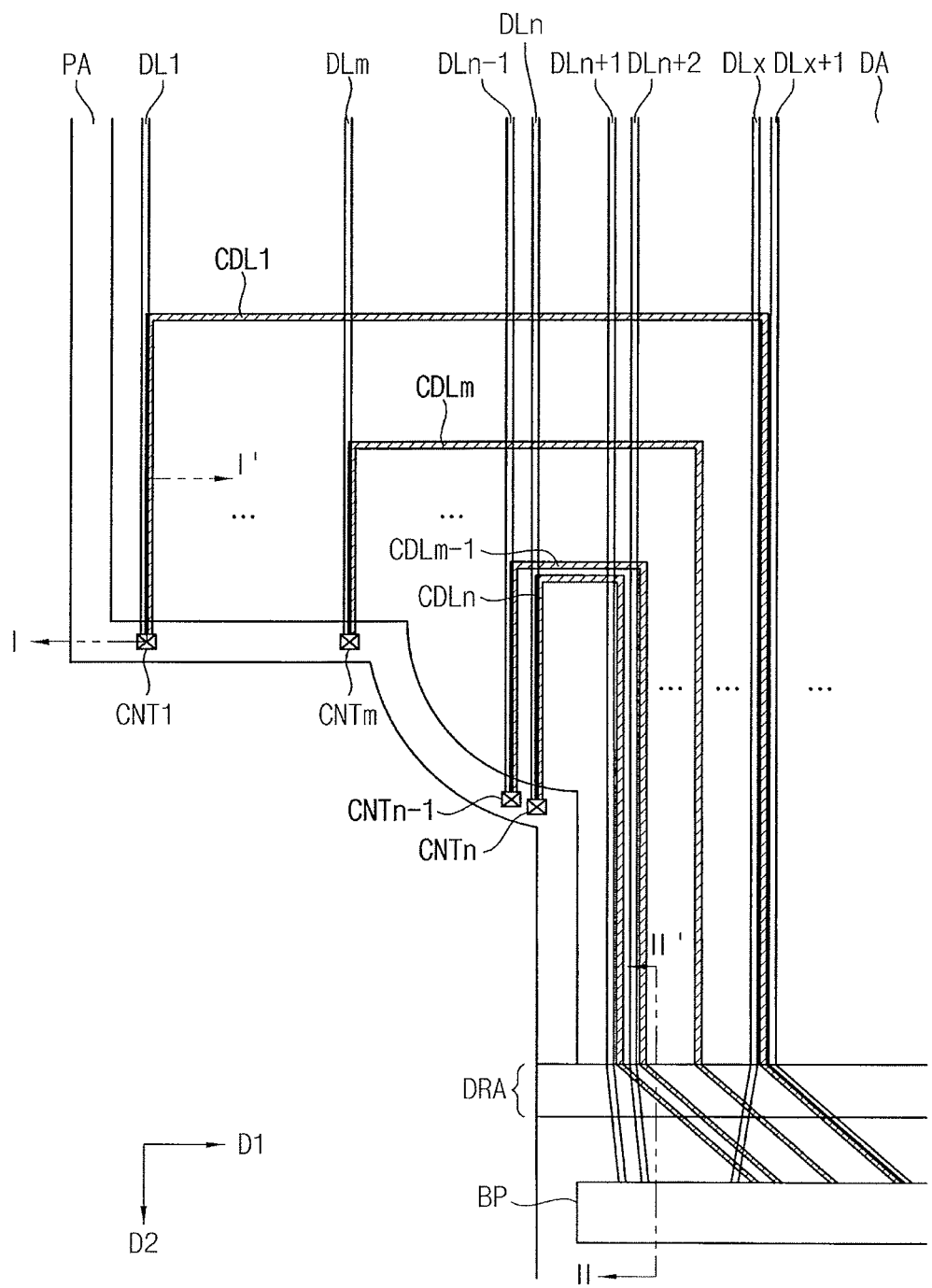
FIG. 11 illustrates an enlarged view of a lower left portion of the display apparatus of FIG. 10.
Figure 12:
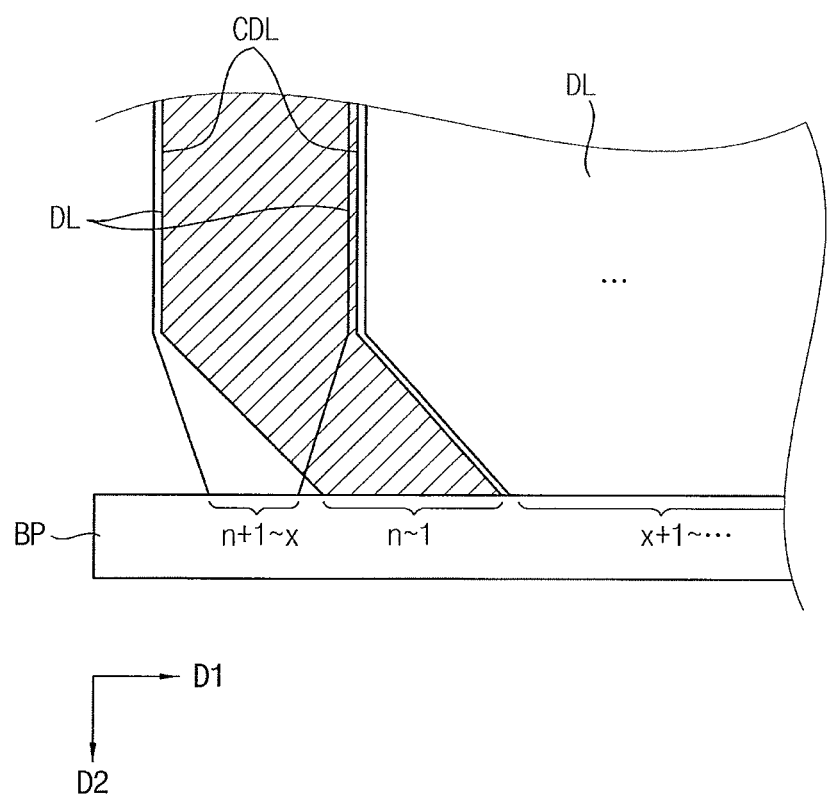
FIG. 12 illustrates an enlarged view to explain a connection of a data line DL, a detour data line CDP and a pad portion BP of the display apparatus of FIG. 10.

FIG. 10 illustrates a plan view of a display apparatus according to an example embodiment. FIG. 11 illustrates an enlarged view of a lower left portion of the display apparatus of FIG. 10. FIG. 12 illustrates an enlarged view to explain a connection of a data line DL, a detour data line CDP and a pad portion BP of the display apparatus of FIG. 10.

Referring to FIGS. 10, 11, and 12, the display apparatus may be substantially same as the display apparatus of FIGS. 1, 2 and 4, except for an order in which a detour data line CDL and a data line DL are connected to a pad portion BP. Therefore, the repetitive description will be simplified.

The display apparatus may include a display area DA in which an image is displayed and a peripheral area PA, which is a non-display area adjacent to and surrounding the display area DA.

The display apparatus may include a plurality of pixels arranged in a matrix form to display the image. The plurality of pixels may be disposed in the display area DA The plurality of pixels may include a thin film transistor. A plurality of data lines and a plurality of gate lines may be electrically connected to the pixels. In addition, the display apparatus may further include a plurality of detour data lines CDL disposed in the display area DA and electrically connected to the respective data lines DL.

The data lines DL may include a first data line DL1, a m-th data line DLm, a n−1-th data line DLn−1, a n-th data line DLn, a n+1-th data line DLn+1, a n+2-th data line DLn+2, and a x-th data line DLx.

The detour data line CDL may include a first detour data line CDL1, a m-th detour data line CDLm, a n−1-th detour data line CDLn−1, and a n-th detour data line CDLn.

Each of the first data line DL1, the m-th data line DLm, the n−1-th data line DLn−1, the n-th data line DLn, the n+1-th data line DLn+1, the n+2-th data line DLn+2 and the x-th data line, and the x-th data line DLx may extend in the second direction D2, so that a portion of the data lines may extend to the peripheral area PA passing the display area DA.

The first data line DL1, the m-th data line DLm, the n−1-th data line DLn−1 and the n-th data line DLn may be electrically connected to the first detour data line CDL1, the m-th detour data line CDLm, the n−1-th detour data line CDLn−1 and the n-th detour data line CDLn through a first contact hole CNT1, a m-th contact hole CNTm, a n−1-th contact hole CNTn−1, and a n-th contact hole CNTn in the peripheral area PA.

The pad portion BP may connect the n+1-th data line DLn+1, the n+2-th data line DLn+2, the x-th data line DLx, the first detour data line CDL1, the m-th detour data line CDLm, and the n-th detour data line CDLn in order along the first direction D1. The pad portion BP may include a plurality of terminals arranged in the first direction D1 and connected to the data lines and the detour data lines, respectively.

Figure 13A:
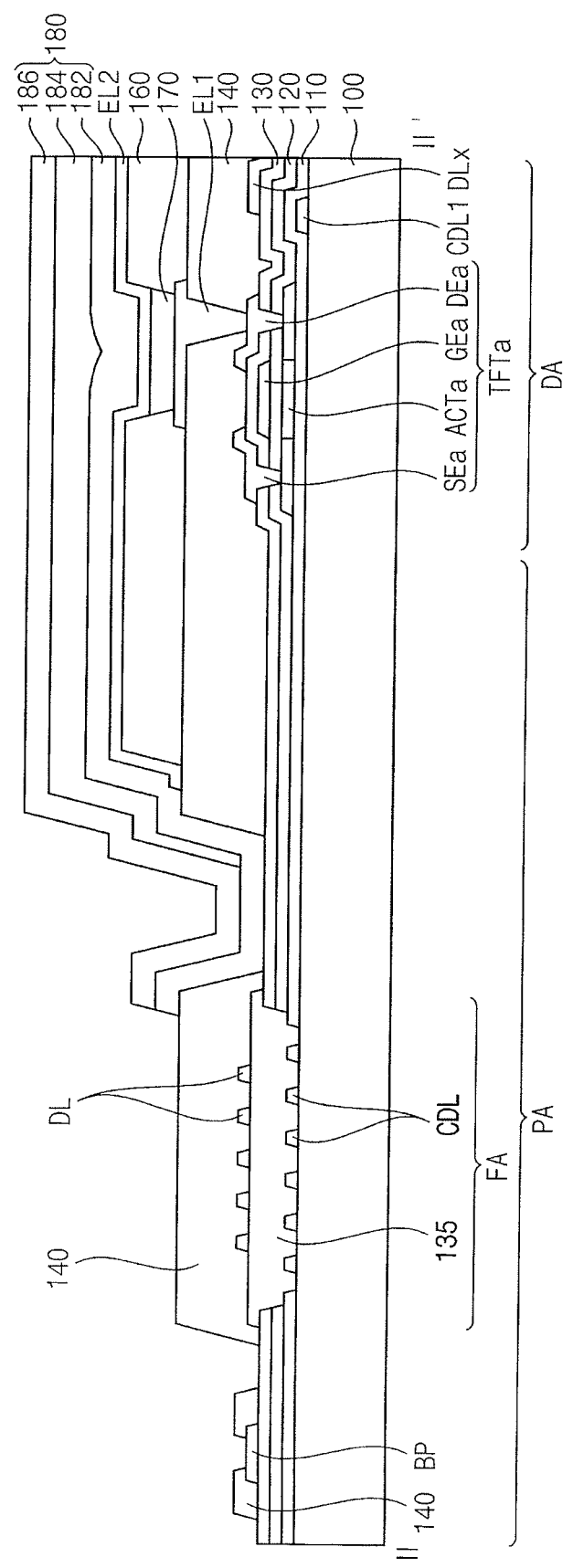
FIGS. 13A and 13B illustrate cross-sectional views of a display apparatus according to an example embodiment.
Figure 13B:
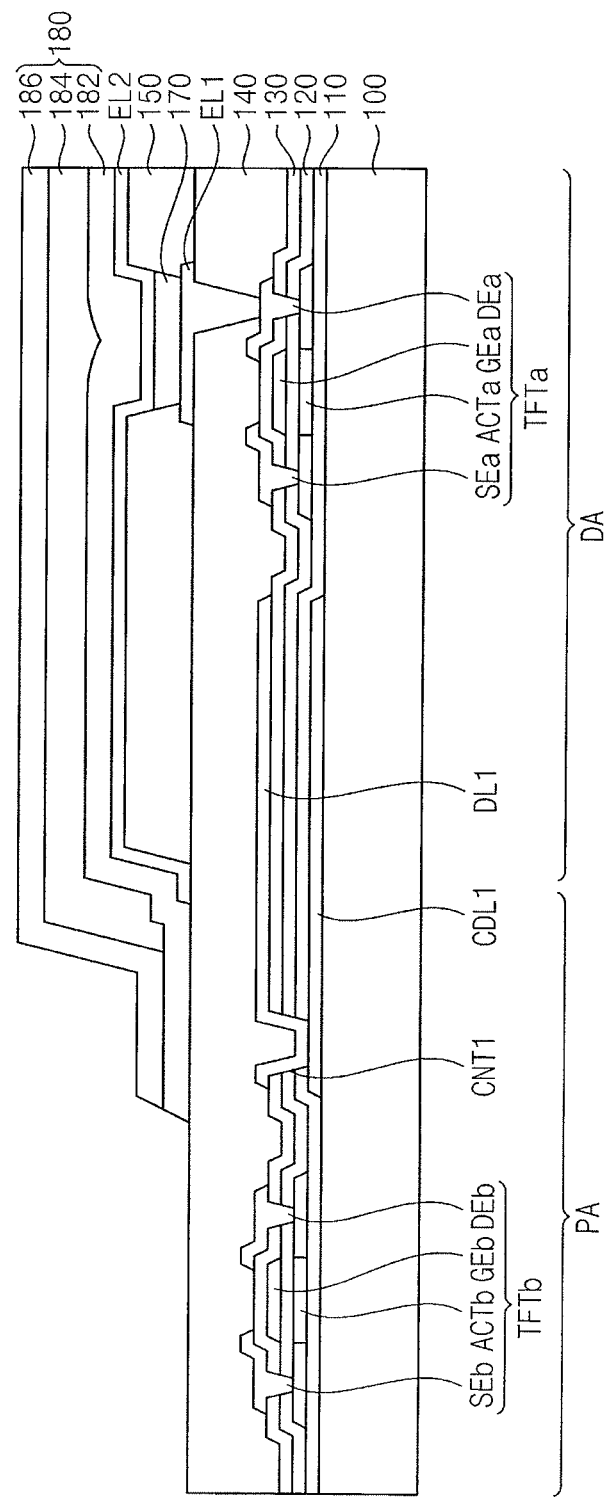

FIGS. 13A and 13B illustrate cross-sectional views of a display apparatus according to an example embodiment.

Referring to FIGS. 13A and 13B, the display apparatus may be substantially same as the display apparatus of FIGS. 3A and 3B, except that a detour data line CDL is disposed below a buffer layer 110 and a second insulating layer is omitted. Therefore, the repetitive description will be simplified.

The display apparatus may include a base substrate 100, a detour data conductive pattern, a buffer layer 110, a gate insulation layer 120, a gate conductive pattern, a data insulation layer 130, an insulation pattern 135, a data conductive pattern, a first thin film transistor TFTa, a second first thin film transistor TFTb, a first insulation layer 140, a first electrode EL1, a pixel defining layer 160, a light emitting structure 170, a second electrode EL2 and a thin film encapsulation (TFE) layer 180.

The detour data conductive pattern may be disposed on the base substrate 100. The detour data conductive pattern may include a detour data line CDL. The detour data line CDL may include a first detour data line CDL1.

The buffer layer 110 may be disposed on the base substrate 100 on which the detour data conductive pattern is disposed.

An active pattern may be disposed on the buffer layer 110. The active pattern may include a first active pattern ACTa of the first thin film transistor TFTa, which is disposed in the display area DA and forms a pixel structure, and a second active pattern ACTb, which is disposed in the peripheral area PA and forms a driving circuit. The first active pattern ACTa may include a first drain region Da, a first source region Sa, and a first channel region Ca. The second active pattern ACTb may include a second drain region Db, a second source region Sb, and a second channel region Cb.

The gate insulation layer 120 may be disposed on the active pattern. The gate conductive pattern may be disposed on the gate insulation layer 120. The gate conductive pattern may include a first gate electrode GEa of the first thin film transistor TFTa, a second gate electrode GEb of the second thin film transistor TFTb, and a signal line such as a gate line for transmitting a signal to drive the pixel.

The data insulation layer 130 may be disposed on the gate insulation layer 120 on which the gate conductive pattern is disposed.

The insulation pattern 135 may be disposed on the base substrate 100 in the folding area FA where the buffer layer 110, the gate insulation layer 120, and the data insulation layer 130 are not formed or removed. The detour data line CDL may be covered by the insulation pattern 135 in the folding area FA.

The data conductive pattern may be disposed on the data insulation layer 130 and the insulation pattern 135.

The data conductive pattern may include a first source electrode SEa and a first drain electrode DEa of the first thin film transistor TFTa, and a second source electrode SEb and a second drain electrode DEb of the second thin film transistor TFTb and a signal line such as a data line DL for transmitting a signal to drive the pixel. In addition, the data conductive pattern may include terminals of the pad portion BP.

The data line DL may include a first data line DL1. The first data line DL1 may be electrically connected to the first detour data line CDL1 in the peripheral area PA through a first contact hole CNT1 formed through the data insulation layer 130 and the gate insulation layer 120 by contacting the first detour data line CDL1.

The pad portion BP may be electrically connected to the detour data line CDL through an additional contact hole (not shown) formed through the data insulation layer 120, the gate insulation layer 120 and the buffer layer 110 in the peripheral area PA.

The first insulation layer 140 may be disposed on the data insulation layer 130 on which the data conductive pattern is disposed.

The first electrode EL1 may be disposed on the first insulation layer 140. The pixel defining layer 160 may be disposed on the first insulation layer 140 on which the first electrode EL1 is disposed. The light emitting structure 170 may be positioned on the first electrode EL1 exposed by an opening of the pixel defining layer 160. The second electrode EL 2 may be disposed on the pixel defining layer 160 and the light emitting structures 170.

The thin film encapsulation (TFE) layer 180 may be formed on the pixel defining layer 160 and the second electrode EL2. The TFE layer 180 may include a first inorganic layer 182, an organic layer 184 and a second inorganic layer 184.

According to the present embodiment, the display apparatus further includes the detour data conductive pattern, as compared to the general display apparatus. However, the detour data conductive pattern is disposed under the buffer layer 110 between the buffer layer 110 and the base substrate 100, so that a width of the peripheral area PA can be reduced without additional insulating layer structure.

Figure 14:
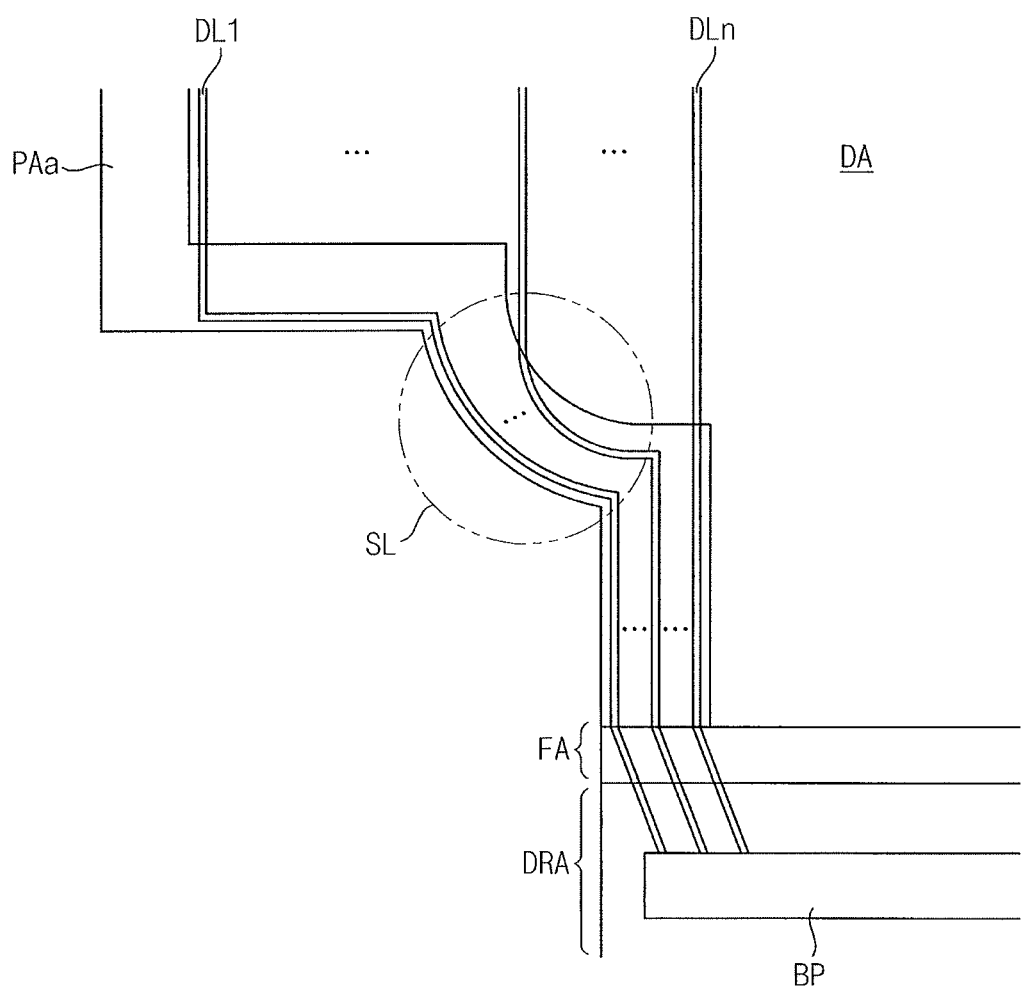
FIGS. 14 and 15 illustrate views showing a comparison between a peripheral area of a general display apparatus a peripheral area of a display apparatus according to an embodiment.
Figure 15:
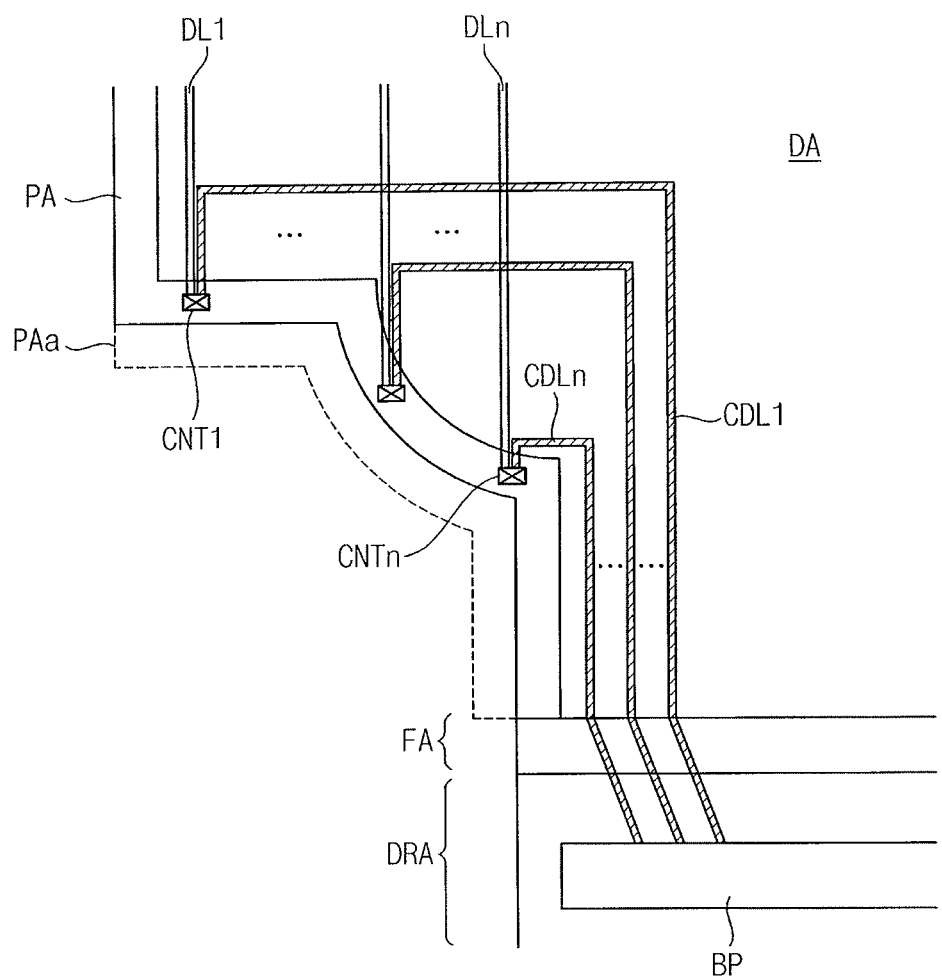

FIGS. 14 and 15 illustrate views showing a comparison between a peripheral area of a display apparatus according to the related art and a peripheral area of a display apparatus according to an embodiment.

Referring to FIG. 14, according to a general display apparatus, first to n-th data lines DL1 to DLn corresponding to an edge of the display area DA extend to a peripheral area PAa to form spider lines SL to be connected to the pad part BP. As a result, the width of the peripheral area PA in which the spider lines SL are formed is increased, and a non-display area of the display apparatus is increased.

Referring to FIG. 15, according to a display apparatus, first to n-th data lines DL1 to DLn corresponding to an edge of the display area DA are connected to first to n-th detour data lines CDL1 to CDLn through first to n-th contact holes CNT1 to CNTn in a peripheral area PA. The first through n-th detour data lines CDL1 to CDLn are connected to the pad portion BP through the display area DA. Thus, the spider line of the prior art can be omitted. As a result, a width of the peripheral area PA is narrowed (compared with the peripheral area PAa of the general display apparatus shown by the dotted line in the figure), and a non-display area of the display apparatus may be reduced.

By way of summation and review, a display apparatus includes a display area in which an image is displayed and a peripheral area that is a non-display area around the display area. Efforts have been made to reduce a width of the peripheral area. According to embodiments, data lines disposed in an edge portion of a display area, in a rounded portion at edges of a front portion of a display area or left and right sides of a circular display area may be electrically connected to a pad portion in a peripheral area through detour data lines. Accordingly, there is no spider line connected to the data line in the peripheral area adjacent to the edge portion and the rounded portion. As a result, a width of the peripheral area can be reduced.

In addition, a folding area may be folded, and a driver area may be disposed on a back surface of the display area to overlap with the display area. Thus, a display apparatus in which the non-display area is minimized can be provided. In particular, embodiments provide a display area in which a size of a non-display peripheral area may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display apparatus, comprising:
    a base substrate;
    a display area and a first peripheral area adjacent to the display area both on a main surface of the base substrate;
    a plurality of data lines disposed in the display area, at least a portion of the data lines extending to the first peripheral area;
    a plurality of detour lines disposed in the display area, at least a portion of the detour lines extending to the first peripheral area; and
    a data driver electrically connected to the data lines and the detour lines, wherein
    at least one of the data lines directly contacts at least one of the detour lines in the first peripheral area.

2. The display apparatus as claimed in claim 1, further comprising:
    a plurality of terminals electrically connecting the data driver to the data lines and the detour lines; and
    a first terminal electrically connected to a first detour line, the first terminal being spaced apart from a second terminal that is electrically connected to a second detour line extending in a first direction in plan view, wherein
    the first detour line electrically contacts a first data line at a first contact area, the first contact area being spaced apart from a second contact area where the second detour line electrically contacts a second data line in a second direction different from the first direction in plan view.

3. The display apparatus as claimed in claim 2, wherein the second direction is opposed to the first direction.

4. The display apparatus as claimed in claim 2, wherein the second direction crosses the first direction.

5. The display apparatus as claimed in claim 1, further comprising:
    a first detour line spaced apart from a second detour line in a first direction in plan view in a second peripheral area, the first detour line being disposed between the display area and the data driver, wherein
    the first detour line electrically contacts a first data line at a first contact area, the first contact area being spaced apart from a second contact area where the second detour line electrically contacts a second data line in a second direction different from the first direction in plan view.

6. The display apparatus as claimed in claim 5, wherein the second direction is opposed to the first direction.

7. The display apparatus as claimed in claim 5, wherein the second direction crosses the first direction.

8. The display apparatus as claimed in claim 1, wherein the detour lines extend to be parallel to each other in the display area.

9. The display apparatus as claimed in claim 1, wherein the detour lines are disposed on the data lines.

10. A display apparatus, comprising:
    a base substrate;
    a plurality of data lines disposed in a display area on the base substrate, at least a portion of the data lines extending to a first peripheral area adjacent to the display area;
    a plurality of detour lines disposed in the display area, at least a portion of the detour lines extending to the first peripheral area; and
    a data driver electrically connected to the data lines and the detour lines, wherein
    at least one of the data lines electrically contacts at least one of the detour lines in the first peripheral area, and
    a first detour line electrically connected to a first data line crosses a second data line.

11. The display apparatus as claimed in claim 10, wherein a portion of the first detour line extends along the first data line in the display area.

12. A display apparatus, comprising:
    a first group of data lines disposed in a first display area and extending to a first peripheral area adjacent to the first display area;
    a second group of data lines disposed in a second display area and extending to a second peripheral area adjacent to the second display area;
    a plurality of detour lines disposed in the first and second display areas and extending to first peripheral area and the second peripheral area; and
    a data driver electrically connected to the data lines and the detour lines and adjacent to the second peripheral area, wherein at least one of the first group of the data lines directly contacts at least one of the detour lines in the first peripheral area, and the display areas and peripheral areas are on a main surface of a substrate.

13. The display apparatus as claimed in claim 12, further comprising:

a plurality of terminals electrically connecting the data driver to the data lines and the detour lines; and a first terminal electrically connected to a first detour line, the first terminal being spaced apart from a second terminal that is electrically connected to a second detour line in a first direction in plan view, wherein the first detour line electrically contacts a first data line of the first group of the data lines at a first contact area, the first contact area being spaced apart from a second contact area where the second detour line electrically contacts a second data line of the first group of the data lines in a second direction different from the first direction in plan view.

14. The display apparatus as claimed in claim 13, wherein the second direction is opposed to the first direction.

15. The display apparatus as claimed in claim 13, wherein the second direction crosses the first direction.

16. The display apparatus as claimed in claim 12, further comprising:

a first detour line spaced apart from a second detour line in a first direction in plain view in the second peripheral area, wherein the first detour line electrically contacts a first data line of the first group of the data lines at a first contact area, the first contact area being spaced apart from a second contact area where the second detour line electrically contacts a second data line of the first group of the data lines in a second direction different from the first direction in plan view.

17. The display apparatus as claimed in claim 16, wherein the second direction is opposed to the first direction.

18. The display apparatus as claimed in claim 16, wherein the second direction crosses the first direction.

19. The display apparatus as claimed in claim 12, wherein at least one of the detour lines crosses at least one of the second group of the data lines in the second peripheral area.

20. A display apparatus, comprising:

a first group of data lines disposed in a first display area and extending to a first peripheral area adjacent to the first display area;

a second group of data lines disposed in a second display area and extending to a second peripheral area adjacent to the second display area;

a plurality of detour lines disposed in the first and second display areas and extending to first peripheral area and the second peripheral area; and a data driver electrically connected to the data lines and the detour lines and adjacent to the second peripheral area, wherein at least one of the first group of the data lines electrically contacts at least one of the detour lines in the first peripheral area, and the detour lines are disposed on the second group of the data lines in the second peripheral area.

* * * * *